INVENTOR
SEYMOUR KASS
BY
C. V. Craddock
ATTORNEY

Sept. 29, 1959 S. KASS 2,906,013

TOOL

Filed July 17, 1956 2 Sheets-Sheet 2

INVENTOR
SEYMOUR KASS
BY R. V. Craddock
ATTORNEY

United States Patent Office 2,906,013 Patented Sept. 29, 1959

2,906,013

TOOL

Seymour Kass, Syosset, N.Y., assignor to Sperry Rand Corporation, a corporation of Delaware Application July 17, 1956, Serial No. 598,335

11 Claims. (Cl. 29—278)

This invention relates generally to hand tools and more particularly to a hand tool for inserting and removing elements in relation to mounting clips.

The invention is described, for purposes of exemplification, in relation to an electrical component such as a crystal diode adapted for mounting in a diode clip. A crystal diode is a conventional electrical component comprising a fragile body usually including a relatively brittle glass or ceramic shell. Extending from the body of the crystal diode are pins of conductive material. The pins function as conductive elements and as support members for mounting the diode in diode mounting clips. The diode clips include resilient prong members that hold the pins of the crystal diode by a snap lock action. Diode clips are also conventional elements usually made of a conductive material and mounted by means of a rivet, screw or soldered connection to a suitable chassis or other electrical component base.

The usual way of inserting the diode into the clip mount is through the use of pressure applied by the fingers to the body of the diode. Appreciable force is required to position the diode in the mounting clip due to the necessity of overcoming the spring force of the mounting clip prongs. This applies an unbalanced force at the approximate center of the fragile diode body and frequently causes damage to the diode element.

The diodes have usually been removed by prying out each pin from the clip with a screwdriver or other similar tool. In removing a diode in this manner, the diode clip is apt to become damaged and even pried from the chassis.

With this customary procedure, it is also possible to damage the fragile body of the diode or damage other components mounted near the diode. In the normal environment of the diode, it is mounted as compactly as possible with other electrical components and as such it is exceedingly difficult to maneuver the usual prying tool into the proper position for removing the diode from the clip mount without damaging the diode or its neighboring components.

When inserting a diode into a diode clip, it frequently happens that the diode is accidently dropped among the components mounted on the chassis and considerable time is wasted endeavoring to recover the diode. Upon removing a diode from the prongs of a mounting device, an unusual force is required to overcome the spring restraint of the prongs such that the diode may inadvertently jump out of the diode amount and may again be lost.

It is therefore a principal object of the present invention to provide a novel tool for inserting and removing an element in relation to an element mounting device whereby the insertion and removal of the element is accomplished with minimum damage to the element or its neighboring components and with a minimum amount of time and effort expended in the operation.

It is a further object of the present invention to provide a manually operable device for inserting and removing components which applies a balanced force to the component and simultaneously holds the component securely.

Another object of the present invention is to provide a tool for inserting and extracting components in relation to mounting brackets in which, during the operation of the tool, a force is applied to the component while a force is simultaneously being applied to the mounting bracket.

The above objects are achieved in the tool disclosed herein by the provision of opposed recesses for holding the end pins of a diode for transport and for exerting pressure on said pins to insert them into or remove them from the diode clips. A cooperating and relatively movable, spring biased plunger is provided with opposed wedge-shaped and slotted members cooperating with said recesses to lock said pins in said recesses during transport and to apply a spreading force on the diode clips while pushing the diode pins against the clips.

Other objects and advantages of the tool of the present invention will become clearly apparent from the following detailed description of an exemplary embodiment thereof described in conjunction with the accompanying drawings, in which like reference characters indicate like elements, wherein.

Figure 1:
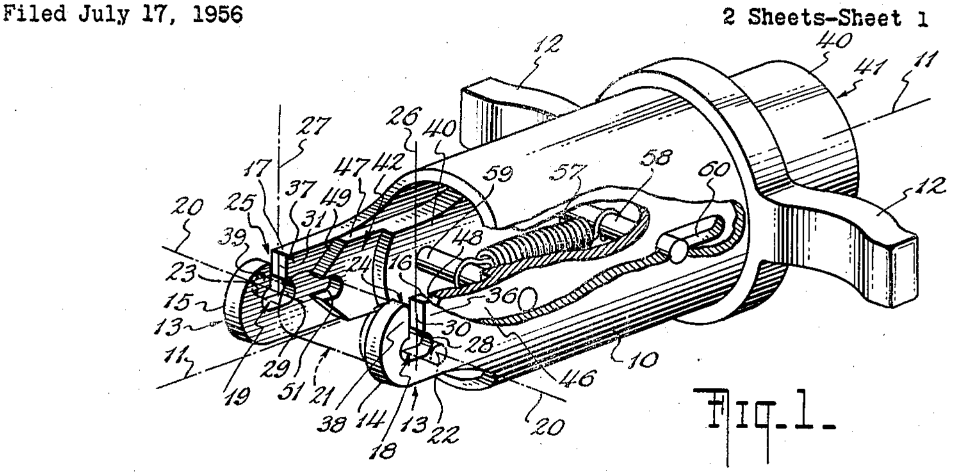
Fig. 1 is a perspective view partially in section of a tool constructed in accordance with the present invention.

In Fig. 1 there is shown a preferred embodiment of a tool constructed in accordance with the present invention for positioning a work element such as diode 21 having work extremities or pins 22 and 23. The tool comprises a hollow body member 10 that may be cylindrical or other convenient shape having a longitudinal axis 11. The body member 10 has a manual gripping means or handle 12 attached to one end thereof while the other end thereof is a work engaging end 13—13 which may be bifurcated. The work engaging end 13—13 may be formed by wall extension means such as wall extensions or arms 14 and 15 extending from said body member 10. In certain embodiments of the invention the wall extension means may comprise an integral part of the body member and may be formed of a single element. The body member 10 in certain embodiments of the invention, may have two opposed sides or arms 14 and 15, each side having an edge or periphery extending substantially parallel to the longitudinal axis 11 such as edges 16 and 17.

Near the extremity of the work engaging end 13—13 of the body member 10, two T-shaped holes or recesses 18 and 19 are diametrically disposed on opposite sides of said longitudinal axis 11 and along a line 20 substantially perpendicular to the axis 11. The recesses 18 and 19 include respective openings 24 and 25, slots 30 and 31, and apertures 28 and 29. The openings 24 and 25 are formed by slots 30 and 31 which connect to oval shaped apertures 28 and 29 respectively. Openings 24 and 25 have axes 26 and 27 respectively extending transversely of said longitudinal axis 11 and substantially at right angles to the line 20 on which said recesses are disposed. The respective openings 24 and 25, which in certain embodiments may be portions of a single opening, extend between said recesses 18 and 19 to allow the work 21 to be positioned between the recesses and to permit entry of work extremities 22 and 23.

In the preferred form of the invention shown herein, the apertures 28 and 29 are substantially diametrically opposed in each of said wall extensions 14 and 15 with respect to the longitudinal axis 11. Substantially diametrically opposed slots 30 and 31 between said respective apertures 28 and 29 and the peripheries or edges 16 and 17 of said wall extensions 14 and 15 are perpendicularly disposed with respect to said longitudinal axis 11. The apertures 28 and 29 preferably each have a greater dimension along the longitudinal axis 11 than each of the slots 30 and 31 thereby providing opposed abutments 36 and 38 on wall extension 14 and opposed abutments 37 and 39 on wall extension 15. The abutments assist in retaining the work extremities 22 and 23 within said apertures 28 and 29. Thus a diametrically disposed aperture is adjacent a different one of said edges in each side and also adjacent a longitudinal extremity of said body member while a slot substantially perpendicular to said longitudinal axis connects each of the apertures to its adjacent edge.

A plunger or member 40 is positionably mounted within the body member 10 and concentric about the longitudinal axis 11 thereof. The plunger 40 has a manually operable end 41 and a work engaging end 42—42 which may be bifurcated. The manually operable end 41 of the plunger 40 is cooperable with the manual gripping means 12 of said body member 10. The end 41 of plunger 40 extends exteriorly in longitudinal relation to the body member 10. The work engaging end 42—42 of said plunger 40 is cooperable with the work engaging end 13—13 of said body member 10.

The work engaging end 42—42 of said plunger 40 has a pair of arms or extensions 46 and 47 projecting from said plunger substantially parallel with said longitudinal axis 11. The respective extremities 48 and 49 of the arms 46 and 47 of the plunger 40 are wedge-shaped or tapered. Each of the wedge-shaped extremities 48 and 49 have a slot therein, respectively, slots 50 and 51. The longitudinal axis of the slot is substantially aligned with the longitudinal axis of its respective wedge-shaped extension such that the extremities 48 and 49 of the arms 46 and 47 of the plunger 40 form two wedge-shaped configurations having their axes of symmetry aligned with the longitudinal axis of said slots 50 and 51. The transverse axis 56 shown in Fig. 2, of each of the slots 50 and 51 is perpendicular to the longitudinal axis 11 of the body member 10.

The slots 50 and 51 in the plunger arms 46 and 47 are cooperable with the apertures 28 and 29 and slots 30 and 31 forming recesses 18 and 19 of said body member 10 and are aligned therewith. The slots 50 and 51 of the plunger 40 and the wedge-shaped extremities 48 and 49 of the plunger are diametrically opposed to each other with respect to the longitudinal axis 11 of the body member 10. The slots 50 and 51 of the plunger 40 are adapted to receive the work extremities 22 and 23 and, in certain of its operating conditions, the arms 46 and 47 surrounding the slots 50 and 51 will overlap the respective slots 30 and 31 and apertures 28 and 29 of the body member 10 to securely engage the work extremities 22 and 23.

The plunger 40 is yieldingly coupled to said body member 10 by a resilient means. In a preferred embodiment of the invention, the resilient means includes a resilient member or spring 57 having two extremities. One extremity is coupled to a first pin member 58 which has its longitudinal axis disposed perpendicularly to the longitudinal axis 11 of the body member 10. The first pin 58 has its extremities connected to the body member 10. A second pin 59 also having its longitudinal axis disposed perpendicularly with respect to the longitudinal axis 11 of the body member 10, is coupled to the other extremity of the spring 57. The extremities of the second pin 59 are connected to the walls of the plunger 40 in spaced relation to said first pin 58. Cooperable with said first pin 58 are diametrically opposed slots 60 and 61 in said plunger substantially parallel to the longitudinal axis 11 of the body member 10. The slots 60 and 61 are so disposed with relation to said first pin 58 that they prevent the plunger 40 from rotating inside the body member 10. The length of the slots 60 and 61 along the longitudinal axis 11 determines the limit of travel of the plunger 40. The effect of the resilient means and slot combination therefore is to allow sliding motion of the plunger 40 relative to the body member 10 along the longitudinal axis 11 thereof for a predetermined travel but fixing the lateral and rotational relative movement of the plunger 40 with respect to the body member 10.

Figure 2:
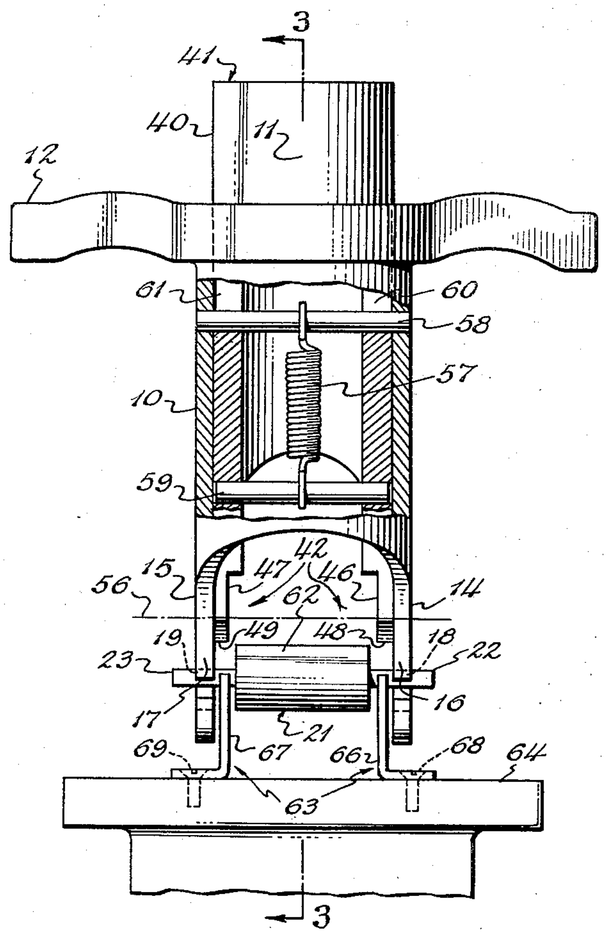
Fig. 2 is a front elevational view partially in section of the device of Fig. 1 showing an element about to be inserted into an element mounting device.
Figure 3:
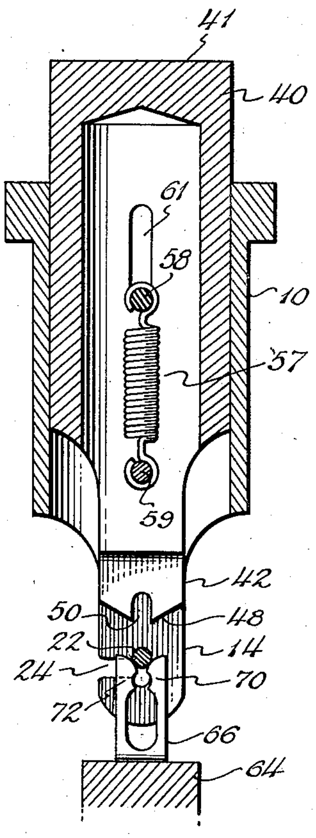
Fig. 3 is a side elevational view in section taken along line 3—3 of Fig. 2.

The operation of the preferred embodiment of the tool of the present invention will now be described in connection with the insertion of an element into an element mounting device by referring to Figs. 1, 2 and 3. The element or work 21 is shown for purposes of exemplification as a crystal diode having a fragile shell or body 62 with work extremities 22 and 23 in the form of pins. The element mounting device 63 is shown mounted on a conventional shift register 64 such as used in computer systems. The element mounting device 63 is indicated as a pair of conventional diode clips or mounting brackets 66 and 67 that may be attached to a shift register or chassis 64 by any suitable coupling means such as rivets, screws or solder and is shown in the drawing as a screwed connection 68 and 69. A diode clip such as 66 comprises a conductive element having a pair of resilient gripping prongs 70 and 72 as shown. When the pins 22 and 23 of the crystal diode 21 are inserted between the prongs 70 and 72 of diode clip 66 and the prongs 71 and 73 of diode clip 67 respectively, the respective prongs of each clip are spread apart due to the force applied in inserting the diode pins and the resiliency of the prongs. Upon insertion of the pins in the clips, the prongs grasp the pins firmly in the grooved portion of the diode clips as shown to produce good electrical contact. Thus to insert or extract the diode from the clips requires considerable force and previously unless it was painstakingly applied, either the diode itself or its neighboring components may have been damaged.

The procedure for inserting the diode 21 into the mounting device 63 utilizing the tool of the present invention eliminates the application of force on the diode body 62. The pin connections 22 and 23 of the diode 21 are placed, for example, in the recesses 18 and 19, respectively of extensions 14 and 15 of body member 10 as indicated in Fig. 2. In a typical embodiment, two fingers of the operator's hand would engage the handle 12 while his thumb would rest on the end 41 of plunger 40. By depressing the plunger 40 through the application of force by the thumb on the manually operable end 41, the spring 57 is extended and the portion of the arms 46 and 47 surrounding slots 50 and 51 will be aligned with and cover the openings 24 and 25 respectively of the body member 10 thereby holding the diode pins 22 and 23 securely. The tool is then positioned so the gripping prongs of the diode clips 66 and 67 are spanned by the extensions 14 and 15 respectively of the body member 10; the pins 22 and 23 rest between the upper portions of the prongs of the clips 66 and 67 respectively; and the longitudinal axis 11 of the tool is substantially perpendicular to the surface on which the diode clips 66 and 67 are mounted. When in this position, the manually applied force is removed from plunger 40. Due to the contraction of spring 57, the plunger 40 is retracted to its inoperative condition and it no longer contacts the pins 22 and 23. As the plunger 40 is retracted, the pins 22 and 23 are engaged by the upper portions of the prongs of clips 66 and 67 and the apertures 28 and 29 respectively. As force is applied to the handle 12 of body member 10 in the downward direction as viewed in the drawing, the upper portion of the apertures 28 and 29 apply a balanced force to the pins 22 and 23 to press the pins between the prongs of clips 66 and 67 respectively. When the pins are snapped into the grooved portions of the prongs, the clips securely grasp the pins, the insertion operation is completed, and the tool is removed by maneuvering the tool to allow the pins 22 and 23 to pass through the openings 24 and 25 respectively.

Figure 4:
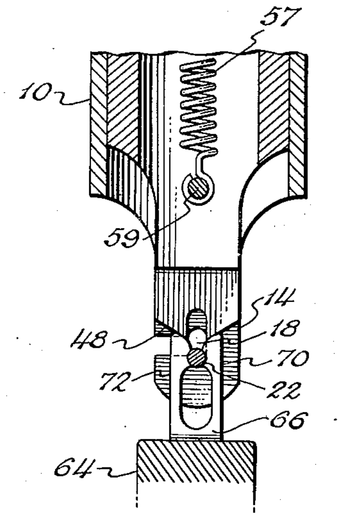
Fig. 4 is a detail of the device as shown in Fig. 3 with the tool in an element-extracting condition.
Figure 5:
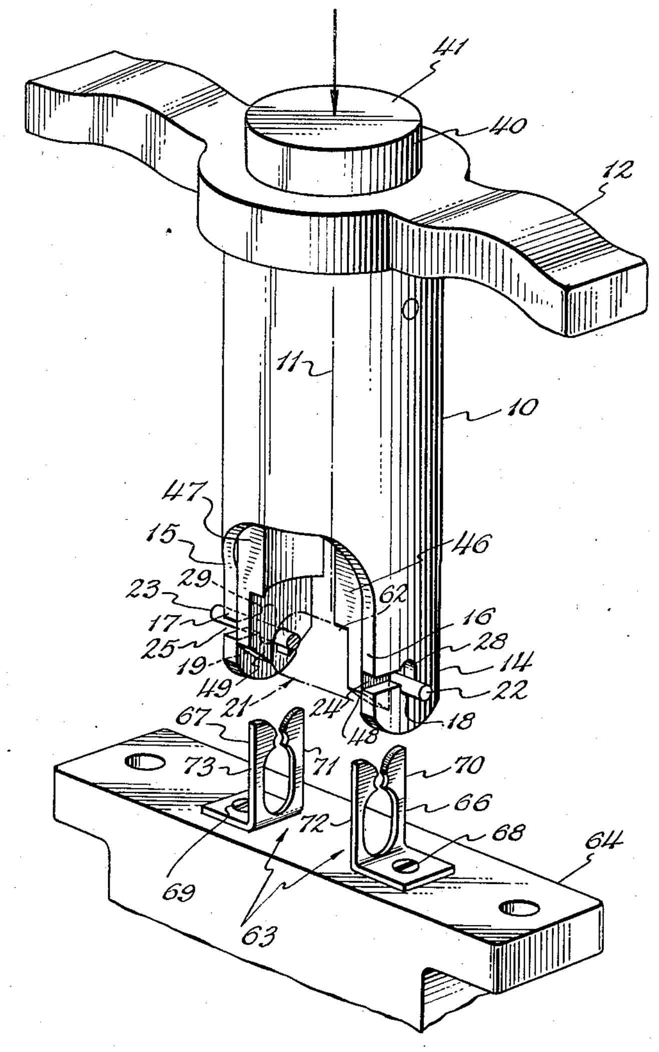
Fig. 5 is a perspective view of the device of Fig. 1 with the extracted element securely held by the tool.

The operation of the preferred embodiment of the tool of the present invention will now be described with reference to Figs. 4 and 5 in connection with the extraction of a crystal diode from a pair of diode clips. The tool is positioned such that the work engaging extensions 14 and 15 of the body member 10 again span the gripping prongs of the diode clips 66 and 67 and the diode pins 22 and 23 are inserted in their respective T-shaped recesses 18 and 19 in a manner similar to that described previously. Thus, the extremities of the diode pins 22 and 23 projecting outside the prongs of the diode clips 66 and 67 are engaged by the bottom portions of the apertures 28 and 29 as viewed in the drawing. The longitudinal axis 11 of the tool is held substantially perpendicularly to the surface on which the diode clips 66 and 67 are mounted. The plunger 40 of the tool is then depressed as previously described until the wedge-shaped extremities 48 and 49 of the extension arms 46 and 47 engage the upper portions of the gripping prongs on the diode clips 66 and 67 respectively. As force is applied to the body handle 12 of the body member by the fingers in an upward direction as viewed in the drawing and by the thumb in a downward direction to the end 41 of the plunger 40, the bottom portions of the apertures 28 and 29 apply a balanced force to the bottom of the diode pins 22 and 23 while the wedge-shaped extremities 48 and 49 simultaneously apply a balanced force to the upper portions of the gripping prongs of the diode clips 66 and 67 respectively to spread the prongs apart. Thus, the relative motion between the bottoms of the apertures which bear on the bottoms of the pins and the wedge-shaped extremities of the plunger which bear on the tops of the diode clips to spread the prongs apart imparts a balanced force to the diode clips and to the extremities of the diode pins which will safely extract the diode from the mounting device without applying a force to the fragile crystal diode body.

When sufficient force has been applied to overcome the resilient force of the gripping prongs, the diode pins will be released therefrom. By maintaining the force on end 41 of plunger 40, the plunger is slidably positioned within body member 10 until the upper portions of the slots 50 and 51 engage the top of the pins 22 and 23 respectively. The diode pins are then securely held between the bottom portions of the apertures 28 and 29 and the upper portions of the slots 50 and 51 as previously described and may be transported safely as long as the plunger is held in a depressed condition.

While the operation of the tool has been above described with specific reference to a diode, it will be understood by those skilled in the art that the tool may also be used with advantage in inserting or removing other electrical components such as resistors, condensers, etc., as well as any other elements, not necessarily electrical, which are snapped into and out of spring holding clips.

It will further be understood that while the body member 10 and the plunger 40 have been hereinabove shown cut away on two sides for better visibility and lightness to form arms 14 and 15, and 46 and 47, it is not necessary that members 10 and 40 be cut away at all on the side opposite the openings 24 and 25. It can further be seen that the recesses 28 and 29 do not need to extend all the way through wall portions 14 and 15 if these wall portions were thick enough with respect to the length of the pins 22 and 23.

While the invention has been described in its preferred embodiments, it is to be understood that the words which have been used are words of description rather than of limitation and that changes within the purview of the appended claims may be made without departing from the true scope and spirit of the invention in its broader aspects.

What is claimed is:

1. A manually operable device for inserting and removing an element in relation to an element mounting device comprising a body member with a longitudinal axis and of such construction as to allow a plunger to be mounted concentrically therein, said member having a work engaging end and a manual gripping means, said work engaging end including wall extensions of said body member having diametrically opposed apertures, diametrically opposed slots between said apertures and the peripheries of said wall extensions perpendicularly disposed with respect to said longitudinal axis, and a plunger concentrically and positionably mounted within said body member with respect to said longitudinal axis, said plunger including a manually operable end and a work engaging end, said manually operable end of the plunger being extended in longitudinal relation to the body member and adapted to be manually operable, said work engaging end comprising wall extensions of said plunger having diametrically opposed slots parallel to said longitudinal axis and open at the extremity of said wall extension and extending from the apex thereof, said wall extensions being positioned apart from each other, each extremity slidable in a longitudinal direction adjacent a different one of the two body apertures, with the slots in said extremities registering with the apertures in the body member.

2. A device as claimed in claim 1 including means coupled to said body member and to said plunger whereby the plunger is prevented from rotating inside said body member and the travel of said plunger is resiliently restrained.

3. A device as claimed in claim 2 in which the extremities of said plunger wall extensions are tapered and cooperable with said element mounting device whereby upon the application of force to said plunger the tapered extremities of said plunger wall extensions engage and open said element mounting device.

4. A tool for inserting and removing elements which are held by pins in mounting clips comprising a hollow cylindrical body member having a longitudinal axis, said member having a gripping portion and work engaging extensions, first diametrically opposed apertures within said extensions adapted to receive said pins, diametrically opposed slots within said extensions between said apertures and the peripheries of said extensions, a plunger positionably mounted within said body member and concentric with said longitudinal axis, said manually operable end of the plunger being extended in longitudinal relation to the body member for manual actuation, arms extending from said plunger having wedge-shaped extremities and second diametrically opposed apertures therein extending from the apex of said extremities cooperable with said first apertures and also adapted to receive said pins, said extremities being positioned apart from each other, each extremity slidable in a longitudinal direction adjacent a different one of the two body apertures, with the second apertures registering with the first apertures, and resilient means yieldingly coupling said body member and said plunger.

5. A tool comprising a body member having a longitudinal axis and of such construction as to allow a plunger to be mounted concentrically therein including a work engaging end and a manual gripping end, said work engaging end including wall extension means having first slots therein diametrically opposed and parallel to said longitudinal axis, said wall extension means also having second slots therein perpendicular to said first slots and to said longitudinal axis forming an opening between said first slots and the peripheries of said extension means, said first slots having a greater dimension along said longitudinal axis than said second slots, said slots being located near the extremity of said wall extension means, and a plunger positionably mounted within said body member and concentric about said longitudinal axis having a manually operable end and a work engaging end, said manually operable end of the plunger being extended in longitudinal relation to the body member, said work engaging end of said plunger comprising arms having diametrically opposed third slots, said third slots being parallel to said longitudinal axis and open at the extremities of said arms and cooperable with the first and second slots, said arms having wedge-shaped extremities, said third slots extending from the apex of said wedge-shaped extremities, said wedge-shaped extremities being positioned apart from each other, each extremity slidable in a longitudinal direction adjacent a different one of the two first slots with the third slots registering with the first slots.

6. A tool of the character described in claim 5 including resilient means yieldingly coupled to said body member and said plunger.

7. A tool of the character described in claim 6 in which the resilient means includes a resilient member having two extremities, a first pin disposed perpendicular to said longitudinal axis connecting with said body member and coupling one extremity of said resilient means, a second pin disposed perpendicular to said longitudinal axis connecting with said plunger and coupling the other extremity of said resilient means, and diametrically opposed fourth slots in said plunger parallel to said longitudinal axis and so disposed with relation to said first pin to prevent said plunger from rotating inside said body member and to limit the travel of said plunger, said fourth slots being in spaced relation with respect to said third slots along said longitudinal axis.

8. In combination, a first member having two opposed sides, said first member being of such construction as to allow a second member to be mounted concentrically therein, each side having an edge extending substantially parallel to the longitudinal axis of said first member, each side having a diametrically disposed aperture adjacent a different one of said edges and also adjacent one longitudinal extremity of said first member, a slot substantially perpendicular to said longitudinal axis connecting each of the apertures to its adjacent edge, said slot being of lesser longitudinal dimensions than said aperture, a second member associated with said first member for relative longitudinal motion but fixed as to relative rotational and lateral motions, a first end of said second member being adapted for cooperation with said aperture and slot in said first member, a second end of said second member being extended in longitudinal relation to the first member for manual actuation, said first end of said second member having diametrically disposed slots connecting with said one extremity of said second member and being substantially parallel with said longitudinal axis and aligned with said apertures, said extremity of said second member forming two wedge-shaped configurations having their longitudinal axes of symmetry aligned with the longitudinal axes of said slots in said second member.

9. In a tool for handling work, a first member having a longitudinal axis and, near one extremity, two holding recesses disposed on opposite sides of said longitudinal axis and along a line perpendicular to said axis, each of said recesses being provided with an opening to permit entry thereinto of work extremities, each of said openings having an axis extending transversely of said longitudinal axis and substantially at right angles to the line on which said recesses are disposed, there being an opening extending between said recesses to allow the work to extend between said recesses, a second member associated with said first member having, at one extremity thereof, two wedge-shaped extensions disposed on opposite sides of said longitudinal axis and along the line perpendicular to said longitudinal axis, the longitudinal axis of each of said wedge-shaped extensions being parallel to said longitudinal axis of said first member, each of said wedge-shaped extensions having a slot therein, the longitudinal axis of each slot being substantially aligned with the longitudinal axis of its respective wedge-shaped extension, and the transverse axis of each of said slots being perpendicular to the longitudinal axis of said first member, said slots being aligned with said recesses and opening at the apexes of said wedge-shaped extensions, said second member being arranged for sliding motion relative to said first member along the longitudinal axis of said first member but fixed as to lateral and rotational relative movement with respect to said first member, and the other extremity of said second member being extended in longitudinal relation to the first member for manual actuation.

10. The tool of claim 9 in which the recesses, at the juncture of the openings therewith, are provided with opposed abutments to help retain the work extremities in said recesses.

11. The tool of claim 9 in which resilient means are provided for urging the second member to slide relative to the first member and in which stop means are provided to limit the relative sliding motion of said first and second members.

References Cited in the file of this patent

UNITED STATES PATENTS

| | | |
|---|---|---|
| 1,575,517 | Albright et al. | Mar. 2, 1926 |
| 1,724,435 | Studwell | Aug. 13, 1929 |